United States Patent [19]
Aviram et al.

[11] 4,440,801
[45] Apr. 3, 1984

[54] METHOD FOR DEPOSITING A METAL LAYER ON POLYESTERS

[75] Inventors: Ari Aviram, Yorktown Heights; Veronica I. Mayne-Banton; Rangaswamy Srinivasan, both of Ossining, all of N.Y.

[73] Assignee: International Business Machines Corporation, Armonk, N.Y.

[21] Appl. No.: 396,922

[22] Filed: Jul. 9, 1982

[51] Int. Cl.$^3$ .............................................. C23C 3/02
[52] U.S. Cl. ..................................... 427/54.1; 427/98; 427/306
[58] Field of Search ........................ 427/54.1, 98, 306

[56] References Cited

U.S. PATENT DOCUMENTS

| | | | |
|---|---|---|---|
| 3,394,023 | 7/1968 | Wilhelm | 427/306 |
| 3,436,468 | 4/1969 | Haberecht | 174/68.5 |
| 3,801,478 | 4/1974 | Heger | 427/54.1 |
| 3,953,658 | 4/1976 | Brandt | 427/306 |
| 4,042,730 | 8/1977 | Cohen et al. | 427/305 |
| 4,165,394 | 8/1979 | Ehrbar | 427/306 |
| 4,229,523 | 10/1980 | Ohta | 430/533 |
| 4,239,789 | 12/1980 | Blum | 427/306 |
| 4,268,536 | 5/1981 | Beckenbaugh et al. | 427/54.1 |

FOREIGN PATENT DOCUMENTS

| | | | |
|---|---|---|---|
| 45-36801 | 1/1970 | Japan | 427/306 |
| 1324653 | 7/1973 | United Kingdom | 427/306 |

OTHER PUBLICATIONS

Feldstein, "Selective Electroless Plating Techniques: A Survey" Plating, Aug. 1970.

Primary Examiner—John D. Smith
Attorney, Agent, or Firm—Jackson E. Stanland

[57] ABSTRACT

A method for selective electroless deposition of a metal (Cu, Ni, Au, Ag) onto a polyester substrate, such as poly(ethylene terephthalate) is described. A combination of ultraviolet exposure of wavelengths <220 nm and a pre-treatment step is used to obtain selective electroless deposition. The polyester layer is first irradiated with uv light of wavelengths <220 nm and is then subjected to a pre-plating pre-treatment with a basic solution. After this, the desired metal is deposited by conventional electroless deposition. Substantial deposition will occur only in those areas which were both exposed to the uv light and subjected to the pre-plating treatment.

20 Claims, No Drawings

METHOD FOR DEPOSITING A METAL LAYER ON POLYESTERS

DESCRIPTION

1. Field of Invention

This invention is a method for depositing metal layers on polyester films, and more particularly to the selective electroless deposition of metal on a polyester film wherein the polyester film is subjected to an initial irradiation with ultraviolet light having a wavelength less than 220 nm.

2. Background Art

In microelectronic circuitry and other applications, it is often necessary to deposit metal layers on a polyester film such as poly(ethylene terephthalate) (Mylar—a trademark of E. I. DuPont de Nemours, Inc.). These metal layers are often used as circuit patterns in microelectronic devices.

Metals, such as copper and nickel, have been deposited on these organic polymer films by processes wherein the entire surface of the polymer has been coated with the metal by vapor deposition. It is then covered with a resist layer which is later exposed to define the pattern of the metal to be left on the polymer. After removal of the unwanted metal, the final circuit pattern is obtained.

Many different plating processes are known for forming metallic layers on polymer substrates. These processes generally use a cleaning step (pre-treatment) of the polymer surface to make it more susceptible for treatment with a sensitizing solution, application of the sensitizer, application of an activator solution to insure the presence of a thin catalytic layer on the polymer surface, and then the electroless deposition of the metal from any of a number of bath compositions. These process steps are described in U.S. Pat. No. 4,042,730, which provides a good background reference. That patent lists various texts generally dealing with electroless plating. In addition, the text Modern Electroplating, issued by the Electrochemical Society, edited by A. Lowenheim and published by Wiley & Sons, New York, 3rd ED, 1974 also describes the electroless plating of metals such as nickel and copper, and describes in detail the different bath compositions and steps which can be used.

In the art, other techniques have been explored to form intricate circuit patterns on a polymer film using, for example, electron beam exposure of selected areas. U.S. Pat. No. 3,436,468 describes such a technique, in which selected areas of a polymer film are exposed to an electron beam, after which metals such as nickel and copper are electrolessly plated on the polymer. These metals plate only those areas of the polymer which have been struck by the electron beam. The electron beam is used to locally decompose the polymer to alter its chemical structure. The altered chemical structure provides a region of the polymer having a lower resistance then the rest of the polymer, thereby promoting electroless plating only in those regions of the polymer struck by the electron beam.

U.S. Pat. No. 4,268,536 describes another process for forming a metal layer on a polymer, wherein ultraviolet light is used to image a pattern on a sensitized surface in order to form catalytic sites for electroless deposition in the imaged area. In that patent, a printed circuit board is fabricated by starting with a substrate such as a polymer-coated metal, pre-treating the substrate to make it more susceptible for treatment with a sensitizer solution, coating the substrate with a sensitizer and drying the coated surface, imaging the desired circuit pattern onto the sensitized surface by ultraviolet radiation, cleaning the substrate to remove unused and unimaged sensitizer, and then electrolessly plating the desired metal. The ultraviolet radiation step produces catalytic sites for electroless deposition by reducing a reducible metal ion contained in the sensitizer coating. In this reference, the ultraviolet radiation acts on the sensitizer coating, located on the polymer film.

In the formation of metallic layers on an organic polymer it is desirable to be able to selectively electrolessly plate with a resolution of two micrometers and less. It is also desirable to be able to provide a reliable process which does not require a great number of steps, and doesn't require the application of successive different solutions to the polymer prior to and during electroless plating thereon. It is also desirable to be able to provide electroless plating on only selected regions of the polymer and to provide such plating in a highly microminiaturized configuration.

Accordingly, it is a primary object of the present invention to provide a method for depositing circuit patterns on a polyester film with a high resolution of the circuit pattern.

It is another object of the present invention to provide selectivity of deposit of a circuit pattern on a polyester layer, where the selectivity is provided by ultraviolet radiation.

It is another object of the present invention to provide an improved process for forming metallic patterns on a polyester layer utilizing a minimum number of steps.

It is still another object of the present invention to provide a process for producing metallic layers on a polyester substrate, in which conventional electroless plating baths can be used, the metallic layers being locally deposited by a novel treatment of the polyester substrate.

It is another object of the present invention to provide an improved technique for depositing metal patterns of a PET (Mylar) substrate.

It is another object of the present invention to provide an improved technique for forming circuit boards, in which metallic layers can be plated on selected areas of a polyester substrate in accordance with an optical technique for determining the areas in which such plating is to occur.

DISCLOSURE OF THE INVENTION

In its broadest sense, this invention is directed to the formation of metallic layers and patterns on a polyester substrate, using electroless deposition of the metal onto selected areas of the polyester, the selected areas being determined in accordance with the incidence of ultraviolet radiation of a specified wavelength range onto the polyester substrate.

After cleaning, the polyester substrate is irradiated with ultraviolet radiation of wavelength less than 220 nm, followed by pre-plating treatment of the exposed areas of the substrate where electroless plating is desired. A typical pre-plating treatment step is immersion of the polyester substrate in a dilute (1:1) ammonia bath. The metal to be deposited is then electrolessly plated onto the polyester substrate using known baths for this purpose. The ultraviolet radiation in this specified wavelength range photochemically acts upon the bonds in a surface layer of the polyester to yield hydroxyl and carboxyl groups. The polyester becomes hydrophillic in these areas, allowing the pre-plating of the polyester substrate to have a selection effect, i.e., no pre-plating treatment results in deposition of the metal in areas not exposed to the ultraviolet radiation; pre-plating treatment results in metallic deposition in areas exposed to the ultraviolet radiation. Therefore, it is possible to obtain either negative or positive images of the pattern defined by the mask through which the ultraviolet radiation passes.

The choice of electroless plating bath is not critical, and can be, for instance, any of those described in the texts and patents cited previously. Further, this method can be used to electrolessly plate metals such as copper, nickel, gold, and silver onto any polymeric material having ester links. The process can be used to fabricate circuit boards for electronic devices, and for other applications.

These and other features, objects, and advantages will be apparent from the following more particular description of the preferred embodiments.

BEST MODE FOR CARRYING OUT THE INVENTION

This is a method for depositing a metallic layer on a polyester substrate, such as a poly(ethylene terephthalate), (PET) layer. The polyester surface is first cleaned to make it free from surface contaminations such as oils, etc. This step is well known in the art, and is essentially the preconditioning procedure described in aforementioned U.S. Pat. No. 4,042,730. Both physical and chemical preconditioning can be used.

After the cleaning step, the polyester film is exposed to ultraviolet radiation having a wavelength less than 220 nm. To do this, a commercially available source, such as an argon-fluorine excimer laser (193 nm) or a low pressure mercury resonance lamp (185 nm) can be used as the light source. These are commercially well known sources, the argon-fluorine laser providing a more powerful output pulse. Both pulse operation and continuous wave operation of the light source is acceptable.

The ultraviolet irradiation can be through a mask, and the optical system used to provide the input radiation can have any design, as long as the wavelength of the radiation striking the polyester is less than 220 nm.

The ultraviolet irradiation of the polyester substrate can range from a few minutes with the mercury lamp to a few nanosecond pulses from the argon-fluorine laser. The purpose of the ultraviolet irradiation is to cause the surface bonds of the polymer to be broken. Irradiation can occur in air, in a nitrogen or oxygen environment, or even in vacuum. The broken bonds of the polymer are oxidized to yield hydroxyl and carboxyl groups which are hydrophilic, i.e., water attracting. In the practice of this invention, this effect has been discovered and it is an important one because it promotes the adhesion of a polyester film to other films, including both metal films and polymer films. Additionally, the ultraviolet irradiation may cause some photoetching of the surface of the polyester layer, in accordance with the teaching of co-pending application Ser. No. 396,985 filed July 9, 1982 and assigned to the same assignee as the present application.

Organic polyesters generally have surfaces which are chemically neutral and hydrophobic. Ultraviolet radiation of wavelengths less than 220 nm causes the surface of the polyester to become acidic, the amount of acid groups being produced depending on the amount of uv exposure, up to a limiting value dependent upon the polyester. At the same time the exposed surface becomes strongly hydrophilic.

After the ultraviolet irradiation, the polyester substrate is immersed in a pre-plating treatment bath, as for example a dilute (1:1) ammonia bath.

The ammonia bath neutralizes the acid groups formed by uv irradiation but maintains the hydrophilicity. Its function is to chemically change the nature of the polyester surface, not just to provide a wash or rinse of the surface, as is its usual function. Electroless plating proceeds much better when the polyester surface is less acidic than it was after the uv exposure. If the ammonia bath is used without first having uv exposure, its effect seems minimal and the subsequent electroless deposition is spotty. Also, if uv exposure is not followed by this pre-plating treatment step, subsequent electroless deposition is also non-existent, or minimal. While this explanation of the effect of the uv irradiation and pre-plating treatment appears to be correct, further development may reveal different effects or other effects which also occur. Regardless of the exact nature of the effect, it is clear that uv radiation in this specified wavelength range provides selective deposition.

The combination of the ultraviolet irradiation at the specified wavelengths and the pre-plating treatment step provides selectivity when metals are to be electrolessly deposited onto the polyester substrate, for the reasons stated in the previous paragraph. For example, ultraviolet irradiation and pre-treatment result in substantial electroless deposition only where the polyester substrate has been both exposed to the ultraviolet light and pretreated. There is very minimal or no metallic deposition in those areas of the substrate which have not been exposed to the ultraviolet radiation prior to the pre-plating treatment.

If there is only ultraviolet irradiation and no pre-treatment, substantial electroless deposition will occur in those areas which have not been exposed to ultraviolet light of these wavelengths. Thus, the ultraviolet irradiation in the specified wavelength range hinders later electroless plating. Pre-treatment of the polyester substrate will also substantially prevent later electroless deposition of the metal layer, except if the pre-plating treated regions of the substrate have been exposed to the ultraviolet radiation prior to the pre-treatment step.

Thus, ultraviolet irradiation and pre-plating treatment can be used to provide electroless deposition in selected areas of the polyester substrate. A combination of ultraviolet irradiation in this wavelength range and pre-treatment in the regions exposed to this radiation allows electroless plating whereas either ultraviolet irradiation in this wavelength range or pre-plating treatment, by itself, will substantially prevent electroless deposition.

Different baths can be used for the pre-plating treatment step. For example, other basic baths such as organic amines or sodium hydroxide 0.02 M may be used.

In the pre-plating treatment step the ammonium ion binds to the carboxyl group, neutralizing it. It is well known that tin (i.e., the metal in the sensitizer) is not soluble in alkaline or neutral solutions and therefore neutralization seems to be essential in order to precipitate tin locally. (The tin is a reducer for the later applied activator, which could be PdCl$_2$ when it is desired to deposit Cu, Ni, or Au.

In the unexposed areas some minute plating occurs also, but it seems that the relative rates of deposition are by far in favor of deposition in the exposed areas. Whatever plating may occur in unexposed areas, can be removed by a quick etch step, such as a quick flush with very dilute nitric acid.

After ultraviolet irradiation and pre-plating treatment, the polyester substrate is ready for electroless plating. The plating process can be any of the well known electroless plating processes in use in the industry, such as a commercial 3-bath technique. For example, for Cu deposition a suitable 3-bath solution would consist of a sensitizer (stannous chloride), and activator (palladium chloride), and a metalizing bath of appropriate composition for the metal (copper, nickel, gold, silver). U.S. Pat. No. 4,042,730 describes the sensitization step and the solutions which are generally used. That patent also describes the times of exposure to the sensitizing solution and the wash step normally employed after the sensitizing step to prevent contamination of the solutions.

The activation step is used to insure the presence of a thin catalytic layer on the polyester surface in order to ensure electroless plating thereon. Generally, a noble metal, such as gold, platinum, palladium, silver, etc. is used in the activation step. The purpose of this step and the procedure used to accomplish it are also described in U.S. Pat. No. 4,042,730. After the activation solution has been applied, a water rinse can also be used of the type previously described for rinsing after the sensitization step.

U.S. Pat. No. 4,042,730 also describes an additional alkaline rinse which is used before electroless plating in the metalizing bath. A rinse of this type can also be used in the practice of the present invention.

The electroless deposition of a metal, such as copper, nickel, gold, silver, is carried out by conventional means using any of the well known electroless plating baths for the metal chosen to be deposited. For example, a typical solution for electroless deposition of copper will contain a copper salt such as copper sulphate, a complexing agent such as sodium potassium tartrate, a reducing agent such as formaldehyde, and sufficient base such as alkaline metal hydroxide to obtain the desired pH. Reference is made to U.S. Pat. No. 4,042,730, and to the William Goldey text cited therein, as well as to the aforementioned references for the concentrations of the copper salt, reducing agent, and complexing agent. Those references also give suitable times for exposure to the plating solution, the times ranging from a period as short as 10 seconds to approximately 1 hour.

EXAMPLES

Selective metalization of a polyester substrate (PET) has been achieved using ultraviolet irradiation of 193 nm and 185 nm. In one example, copper lines 1 micrometer wide were deposited on the substrate, and were found to be electrically conducting. Another example used the following steps in the deposition:

A metal mask consisted of 10 mil lines 1 cm long. The mask was held against a pre-cleaned PET film 10 mil thick by means of a fused silica window. ArF laser exposure was with 193 nm pulses of energy 100 mJ/cm$^2$. The duration of each pulse was 12 nsec. Successive lines in the pattern were exposed to 2, 4, 8, 16 and 20 pulses. Following exposure, the sample was treated with ammonia (1:1) solution for 1 minute. This was followed by electroless copper plating, in the manner previously described. All exposures gave satisfactory lines. For best results, the PET film should be cleaned prior to exposure, using for example, acetone, water wash, 1:1 nitric acid and deionized water wash.

In the practice of this invention, metal layers are selectively deposited on a polyester substrate using ultraviolet irradiation of wavelengths less than 220 nm for determining the patterns. This allows the deposition to be well controlled and held to a resolution of 2 micrometers and less. The steps of the process include irradiation in this specified wavelength range, pre-plating treatment as described, and electroless plating in accordance with well known techniques.

While the invention has been described in terms of specific embodiments, it will be appreciated by those of skill in the art that variations therein can be made in accordance with the principles of the invention.

Having thus described our invention, what we claim as new and desire to secure by Letters Patent is:

1. A method for deposition of a metal layer onto selected areas of a polyester substrate, comprising the steps of:
   irradiating said polyester substrate with ultraviolet radiation of wavelengths less than 220 nm to create acid groups where said substrate is irradiated by said uv radiation,
   neutralizing said acid groups in said irradiated polyester substrate to make them more basic, and
   electrolessly depositing said metal onto said polyester substrate to form a continuous metal layer thereon, said depositing occurring substantially in those areas of said substrate where said neutralizing has occurred.

2. The method of claim 1, where said metal is chosen from the group consisting of copper, nickel, gold, and silver.

3. The method of claim 1, where said substrate is PET.

4. The method of claim 3, where said neutralizing step includes contacting said irradiated substrate with a basic solution.

5. The method of claim 4, where said metal is selected from the group consisting of copper, nickel, gold, and silver.

6. A method for the deposition of a metal layer onto selected areas of a polyester substrate, comprising the steps of:
   irradiating said polyester substrate with ultraviolet radiation of wavelengths less than 220 nm, and
   electrolessly depositing said metal onto said polyester substrate to form a continuous metal layer thereon, said depositing occurring only in those areas of said substrate not exposed to said ultraviolet radiation.

7. The method of claim 6, where said substrate is PET.

8. The method of claim 7, where said metal is selected from the group consisting of nickel, copper, gold, and silver.

9. A method for depositing a metal layer onto selected areas of a polyester substrate, comprising the steps of:
   irradiating said polyester substrate with ultraviolet radiation of wavelengths less than 220 nm to photochemically alter surface bonds in said polyester substrate, contacting regions of said polyester substrate exposed to said ultraviolet radiation with a basic solution, and electrolessly depositing said metal onto said regions of said substrate to form a continuous metal layer thereon.

10. The method of claim 9, including the step of cleaning said polyester substrate prior to incidence of said ultraviolet radiation.

11. The method of claim 9, where said substrate is comprised of PET.

12. The method of claim 9, where said metal is selected from the group consisting of Ni, Cu, Au, and Ag.

13. The method of claim 9, where said substrate is PET, and said metal is selected from the group consisting of Ni, Cu, Au, and Ag.

14. The method of claim 9, where said ultraviolet radiation passes through a mask before striking said substrate.

15. The method of claim 9, where said electrolessly depositing step includes the application of a sensitizer on said substrate, followed by application of an activator solution to said substrate, and then followed by exposure of said substrate to a metal electroless plating bath.

16. The process of claim 9, where said basic solution is a dilute ammonia solution.

17. A method of depositing a copper layer onto selected areas of a polyester substrate, comprising the steps of:

exposing said selected areas of said substrate to irradiation by ultraviolet radiation having wavelengths less than 220 nm, treating said selected areas of said substrate with a basic solution to chemically alter said selected areas, exposing said selected areas to a sensitizing solution comprising an acidified aqueous solution to form a sensitized surface on said areas.

activating the sensitized surface in said selected areas by exposing said areas to an acidified solution of noble metal ions to produce a catalytically active surface in said selected areas, and exposing said catalytically active surface to an alkaline electroless copper plating solution to deposit copper on said substrate.

18. The method of claim 17, where said substrate is PET.

19. A method for depositing a metal layer onto selected areas of a polyester substrate, comprising the steps of:

irradiating said selected areas of said polyester substrate with uv radiation of wavelengths less than 220 nm to make said irradiated areas hydrophilic, contacting said selected areas with a solution to make said selected areas more basic, and electrolessly depositing said metal onto said selected areas to form a continuous metal layer thereon.

20. A method of claim 19, where said metal is selected from the group consisting of Cu, Ni, Au and Ag.

* * * * *